United States Patent [19]

Heichler

[11] Patent Number: 4,939,734
[45] Date of Patent: Jul. 3, 1990

[54] METHOD AND A SYSTEM FOR CODING AND DECODING DATA FOR TRANSMISSION

[75] Inventor: Johannes Heichler, Murrhardt 3, Fed. Rep. of Germany

[73] Assignee: ANT Nachrichtentechnik GmbH, Backnang, Fed. Rep. of Germany

[21] Appl. No.: 242,318

[22] Filed: Sep. 9, 1988

[30] Foreign Application Priority Data

Sep. 11, 1987 [DE] Fed. Rep. of Germany ....... 3730547

[51] Int. Cl.$^5$ ............................................. G06F 11/10
[52] U.S. Cl. ......................................... 371/43; 375/27
[58] Field of Search ....................... 371/43, 44, 45, 46; 375/27, 38, 39

[56] References Cited

U.S. PATENT DOCUMENTS

| | | | |
|---|---|---|---|
| 4,483,012 | 11/1984 | Wei | 371/43 X |
| 4,489,418 | 12/1984 | Mazo | 375/27 |
| 4,713,817 | 12/1987 | Wei | 371/43 |

*Primary Examiner*—Jerry Smith
*Assistant Examiner*—Robert W. Beausoliel
*Attorney, Agent, or Firm*—Spencer & Frank

[57] ABSTRACT

A method and a system for processing a data stream for transmission. In order to process the data stream for transmission, particularly for satellite transmission, data substreams are formed and then difference coded and convolutionally coded. After the data substreams are coded, they are combined into phase components in such a manner that all phase components contain convolutionally coded data from each data substream. The convolutional decoding of each data substream again utilizes all phase components.

16 Claims, 6 Drawing Sheets

METHOD AND A SYSTEM FOR CODING AND DECODING DATA FOR TRANSMISSION

BACKGROUND OF THE INVENTION

The present invention is based on a data processing method of processing data for transmission purposes and more particularly to such a method in which an input data stream is subjected to difference and convolutional coding after being subdivided into a plurality of data substreams of slower processing speed, and subsequently combined for transmission into at least two phase components.

In processing data subjected to difference coding and to convolutional coding, it is known to divide these data, particularly if high data rates are involved, into data substreams. In a TDRSS (Tracking and Data Relay Satellite System) system, the data substreams are individually convolutionally coded and are combined by means of multiplexers into interleaved output data streams which are then fed to a QPSK (Quadrature Phase Shift Keyed) modulator for transmission. At the receiving end, there then occurs the corresponding conversion. See for example, IEEE Global Telecommunications Conference, Globecom 83, San Diego, USA, Conference Record S, pages 1050–1053. For correct synchronization it is necessary to either have a fixed data transmission format or additional information must be transmitted, for example an added PN (pseudonoise) sequence. Again, see the above Globecom 83 publication.

SUMMARY OF THE INVENTION

It is an object of the present invention to provide a method of processing a stream of input data with convolutional and division coding which is neither bound to a fixed data transmission format nor requires additional information. Moreover, an arrangement is provided for the implementation of such a method. This is accomplished with respect to the method by difference coding and then convolutional coding the data substreams separately, forming each phase component for phase modulation transmission of the convolutional code data streams of each data substream and using the data of all phase components for convolutional decoding of each data substream after reception and demodulation of the transmitted data.

A system in accordance with the invention for performing the transmit portion of the method includes a demultiplexer for forming data substreams from the input data stream, difference coders for processing each data substream, convolutional coders for processing the difference coded data of each data substream, at least two first multiplexers coupled to the convolutional coders for forming phase components composed of convolutionally coded data streams, in such a manner that each one of the phase components is a combination of the convolutionally coded data substreams.

The receive portion of the method may be performed by at least two second multiplexers for dividing the transmitted phase components into data substreams, convolutional decoders for the data substreams which ar connected with the outputs of the second multiplexers in such a manner that each convolutional decoding is effected from all phase components, difference decoders each connected to a corresponding convolutional decoder, and a third multiplexer for combining all decoded data substreams.

The method according to the invention has the following advantages:

The bit error rate is lower than in a conventional TDRSS system since difference decoding can take place immediately after convolutional decoding by means of a Viterbi decoder without the intermediary of a multiplexer. This is based on the following consideration: at the output of an individual Viterbi decoder, bit error rates are lower than at the output of a multiplexed combination of such stages. Since a difference decoder multiplies the bit error rate, such an error rate is greater in a conventional TDRSS system if one considers that the Viterbi decoder emits burst disturbances which the difference decoder does not evaluate as highly as individual disturbances. Such individual disturbances occur if one scans the Viterbi decoder for each data substream by means of a multiplexer as in the conventional TDRSS system and then performs difference decoding.

No special synchronization measures are required, not even a node synchronization.

Phase ambiguities can be detected without special measures by each decoder of a data substream. If a decoder has detected the correct phase position, it is able to forward this information to the decoders for the other data substreams, which results in faster synchronization.

BRIEF DESCRIPTION OF THE DRAWINGS

These and other features and advantages of the invention will be more completely understood from the following detailed description of the preferred embodiment with reference to the accompanying drawings in which.

DESCRIPTION OF THE PREFERRED EMBODIMENT

Figure 1:
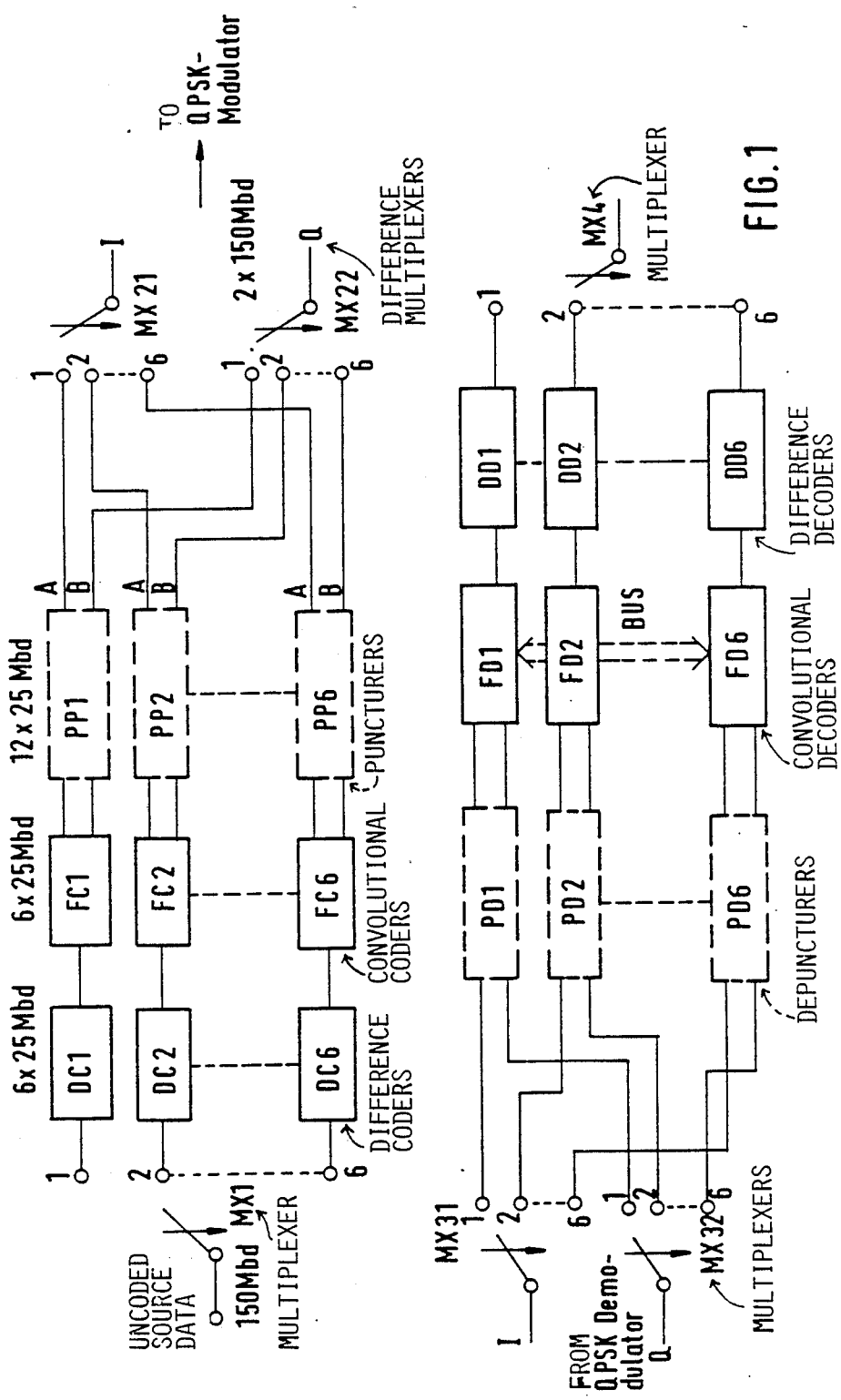
FIG. 1 is a block circuit diagram for implementation of the method according to the invention.

As shown in FIG. 1, uncoded source data are fed at a data rate of, for example, 150 Mbd to a demultiplexer MX1 which divides the uncoded source data stream into six parallel data substreams, each having a data rate of 25 Mbd. Each data substream is individually difference coded by means of difference coders DC1, . . . , DC6 and subsequently convolutionally coded by means of convolutional coders FC1, . . . , FC6, each of which outputs a set of output streams. If necessary, the output data streams of convolutional coders FC1, . . . , FC6 are fed through code puncturers PP1, PP6 in order to increase the code rate. In the embodiment of FIG. 1, convolutional coders are employed which furnish two output bit streams, namely the I and Q channels—for different phase components—for QPSK transmission. In principle, however, convolutional coders which furnish more than two output bit streams and employ a different type of transmission, e.g. 8-PSK, can of course also be employed. The two output bit streams of each convolutional coder are fed to two different multiplexers MX21 and MX22 in such a manner that one output bit stream A of a first phase type from each convolutional coder is fed only to multiplexer MX21 and one output bit stream B of a second phase type is fed only to multiplexer MX22. Multiplexer MX21 serially combines all output bit streams A of the first type into an output data stream I and multiplexer MX22 serially combines all output bit streams B of the second type into a output data stream Q. Data streams I and Q are phase components for QPSK modulation and each have a bit rate of 150 Mbd. By connecting multiplexers MX21 and MX22 in this manner, it is ensured that data stream I as well as data stream Q is composed of all convolutionally coded data streams and the advantages of the invention, such as low bit error rate, phase ambiguity detection and fast synchronization without additional information or frame structure, become fully effective. Data streams I and Q are forwarded to a QPSK modulator for transmission.

At the receiving end, phase components I and Q obtained by means of a QPSK demodulator are divided again in correspondence with their processing at the transmitting end to six parallel branches. Demultiplexer MX31 distributes data stream I at the receiving end to six parallel branches and demultiplexer MX32 distributes data stream Q likewise to six parallel branches. The data rates of data streams I and Q are each 150 Mbd and the data rate at the output of the two multiplexers is combined total of 12×25 Mbd. Two parallel branches at a time, one of which originates from data stream I and one from data stream Q, are fed (via depuncturers PD1, ..., PD6 if puncturers are provided at the coders) to the two respective inputs of a convolutional decoder, FD1, ..., FD6. Since each one of these convolutional decoders has only one output, convolutional decoders are provided at a rate of R=½. The output data stream from each of the six convolutional decoders FD1, ..., FD6 at a bit rate of 25 Mbd is now fed to a corresponding one of difference decoders, DD1, ..., DD6. The output data streams from the six difference decoders are serially added by a multiplexer MX4 so that a decoded received data stream of 150 Mbd is available.

Figure 2:
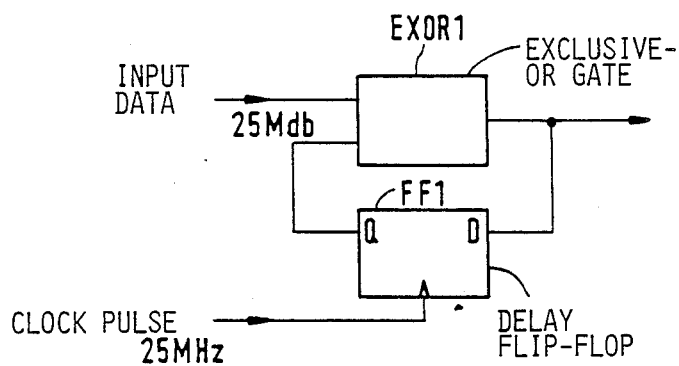
FIG. 2 shows the configuration of a difference coder.

The individual components of the block circuit diagram of FIG. 1 will now be described in greater detail. FIG. 2 shows a difference coder as it is provided for each of the six 25 Mbd data substreams. The input data stream is fed to one input of an exclusive-OR gate EXOR1. The output of this exclusive-OR gate EXOR1, which constitutes the output of the difference coder, is returned via a D-flip-flop FF1 acting as a delay element to the second input of gate EXOR1. Flip-flop FF1 is clocked by a 25 MHz clock pulse signal.

Figure 3:
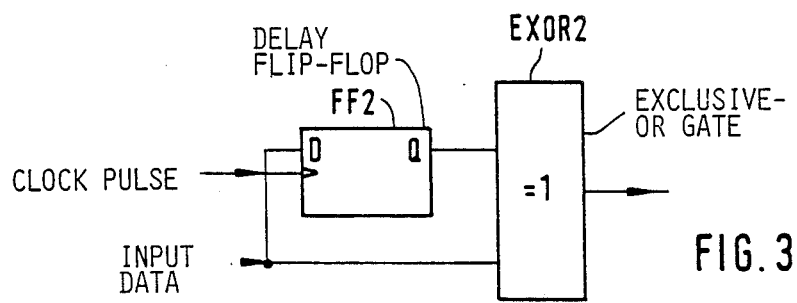
FIG. 3 shows the configuration of a difference decoder.

FIG. 3 shows the corresponding difference decoder at the receiving end. The output signal of each convolutional decoder travels as an input signal for difference decoding to the first input of an exclusive-OR gate EXOR2 and, delayed in a D-flip-flop FF2, to the second input of this gate. A decoded data substream is available at the output of each exclusive-OR gate EXOR2 and these substreams are combined by means of multiplexers MX4 to form the total data stream at the receiving end. Flip-flop FF2 is clocked in the same manner as at the transmitting end by means of a 25 MHz clock pulse signal.

Any desired arrangements can be utilized as convolutional coders FC1, ..., FC6 and convolutional decoders FD1, ..., FD6. Particularly suitable are the arrangements disclosed in U.S. Pat. No. 4,757,506 since the Viterbi decoder employed there permits real time processing.

Figure 4:
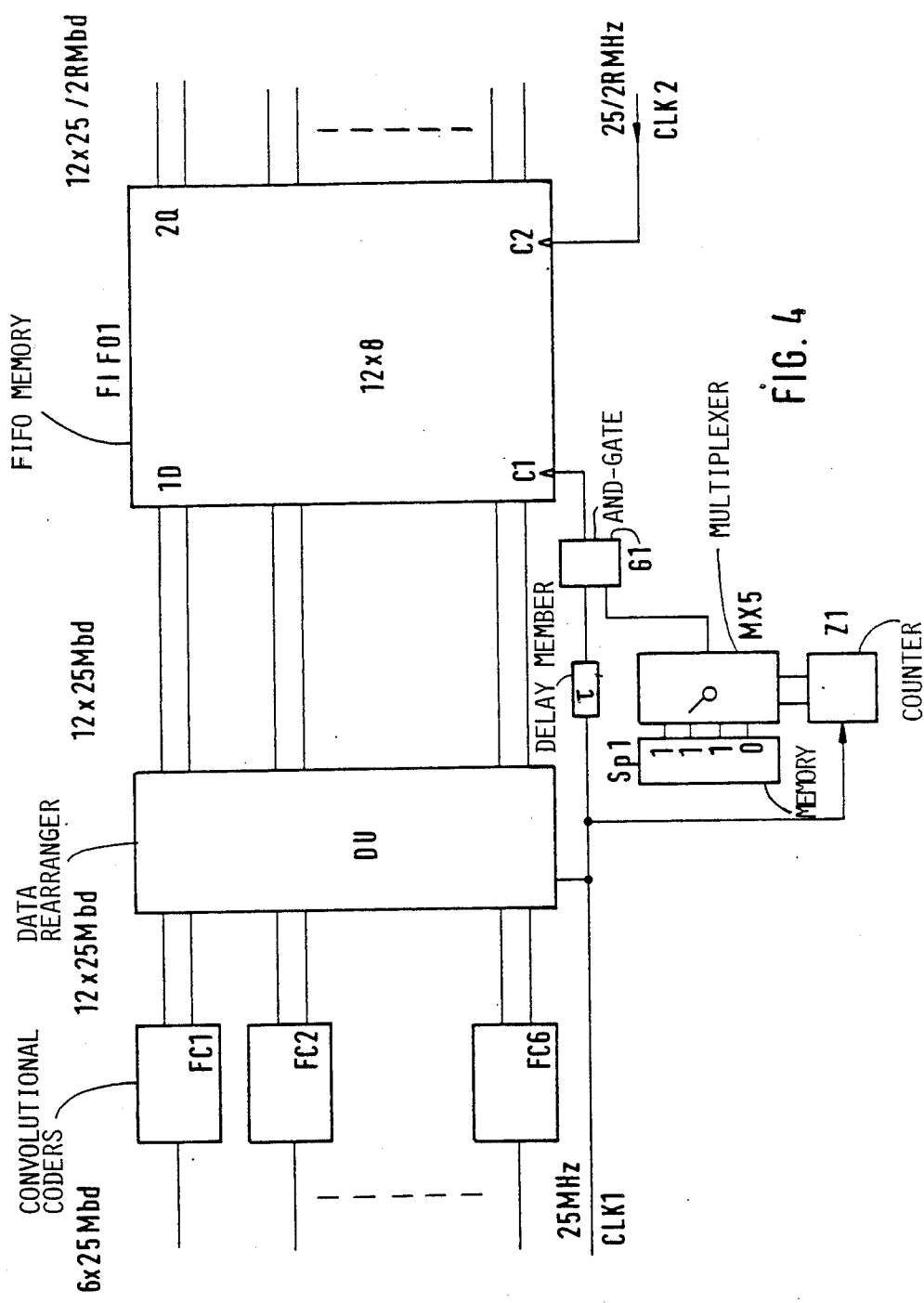
FIG. 4 is a block circuit diagram for parallel punctured coding.
Figure 4A:
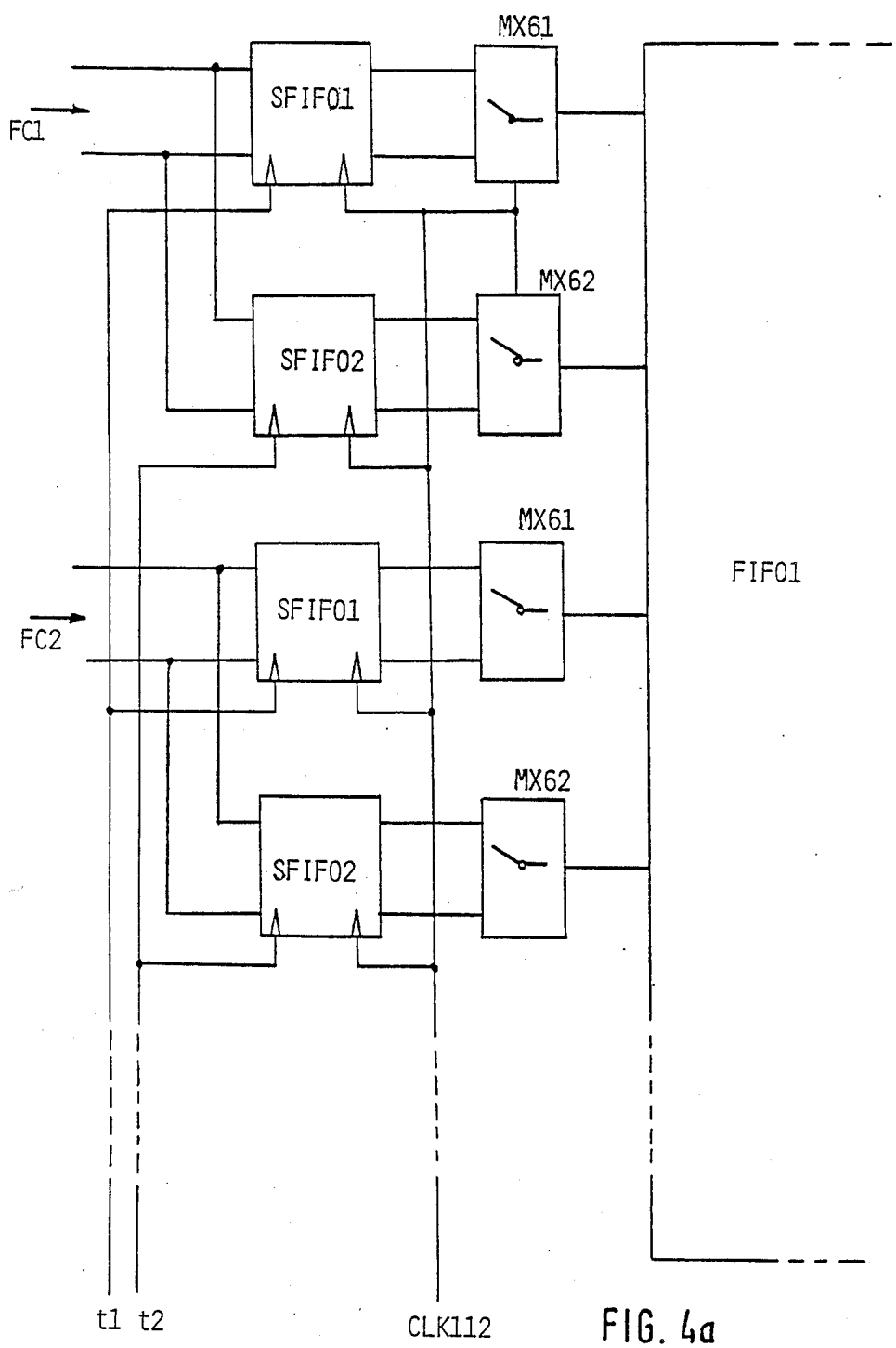
FIG. 4a shows data rearrangement.
Figure 5:
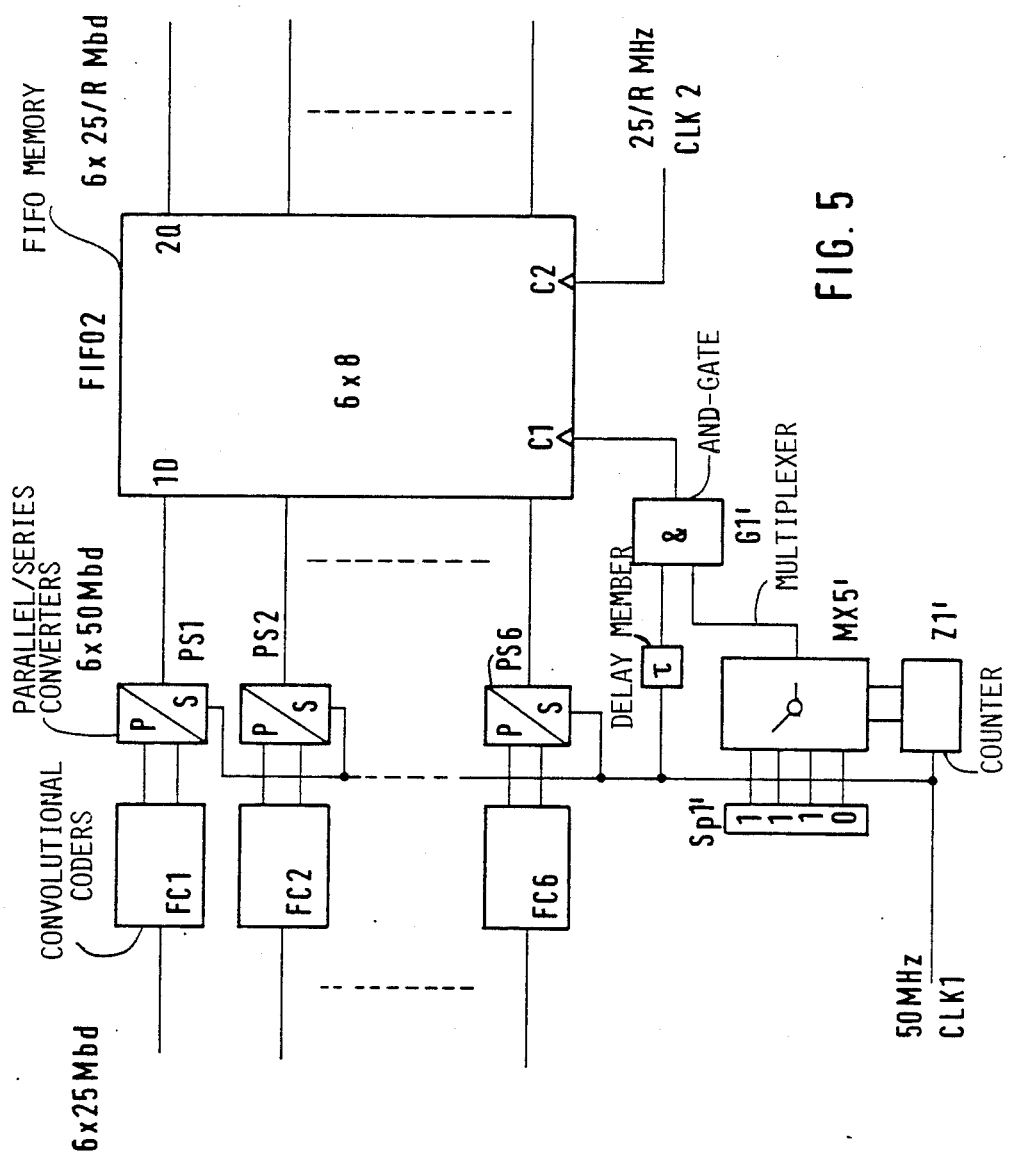
FIG. 5 is a block circuit diagram for series punctured coding.

If it is desired or necessary to perform code puncturing, this may advantageously be performed after the convolutional coding. Such code puncturing may be parallel or serial. FIG. 4 is a block circuit diagram for parallel code puncturing and FIG. 5 is a block circuit diagram for serial code puncturing. In the case of parallel code puncturing, the convolutionally coded data substreams are first fed to a data rearranging stage DU composed, for example, of flip-flops so as to adapt the data substreams to a 12×8 format FIFO (first in, first out) memory FIFO1. An integrated circuit, for example a TDC 1030 made by TRW, may be employed as FIFO memory FIFO1. This FIFO memory receives as its write clock a clock pulse which includes an interruption for the bits to be omitted—punctured. This write clock interruption is realized by an AND-gate G1 which receives, on the one hand, a continuous clock pulse CLK1 and, on the other hand, the output signal of a multiplexer MX5. The code puncturing pattern (deleting map) is stored in a memory Sp1 in the form of a 1-0 sequence having a width of P bits and is switched through to AND-gate G1 by multiplexer MX5. Here the number P corresponds to the puncturing period, which itself is a function of the puncturing code used. As soon as multiplexer MX5 switches a 0 from the deleting map to gate G1, the write clock is interrupted. Switching of multiplexer MX5 is controlled by clock pulse CLK1 via a counter Z1. In order to suppress spikes, gate G1 is not charged directly with clock pulse CLK1 but instead with a clock pulse which has been sliqhtly delayed in a delay member 2 and which considers the switching times of multiplexer MX5. The read clock pulse CKL2 for parallel code puncturing is continuous. The basic function of the code puncturer is similar to that disclosed in Conf. Proc. 6th Internat. Conf. on Digital Satellite Communications, page XII-26, FIG. 5, but processing is parallel and thus twice the number of data can be put through at the same clock pulse rate. FIG. 4a shows parallel code puncturing in more details, as to data rearrangement. The data rearranger DU shown in FIG. 4 consists of a separate rearranger for each of 6 channels, as can be seen in FIG. 4a. For each of the 6 channels the convolutionally coded data substreams are supplied in parallel to two elastic FIFO memories SFIFO1 and SFIFO2. The SFIFO1 and SFIFO2 are provided as parallel-parallel converters. The encoder output signals for the full period of P bits each can alternately read into these memories of their writing clock rates t1 or t2. Read out of the data takes place continously at common read clock rate which is half the clock rate CLK1. The two bit streams each per memory are guided across a downstream multiplexer MX61 or MX62 as means for parallel-serial conversion. Clock rate CLK½also serves as to the control signals for the stepping of the multiplexers MX61 and MX62. After this data rearrangement parallel puncturing is done as shown in FIG. 4 with FIFO memory FIFO1 which punctures the data of all the 6 channels in parallel.

The depuncturer PD1 at the receiving end is constructed correspondingly, but here the read clock of the FIFO member is interrupted instead of the write clock. The read clock is interrupted by means of the same components, i.e. AND-gates, multiplexers, memories for the deleting map and counters. However, downstream of the FIFO memory there is an additional multiplexer which cuts in so-called dummy bits, i.e. metrically neutral filler data, during the read intervals.

Figure 6:
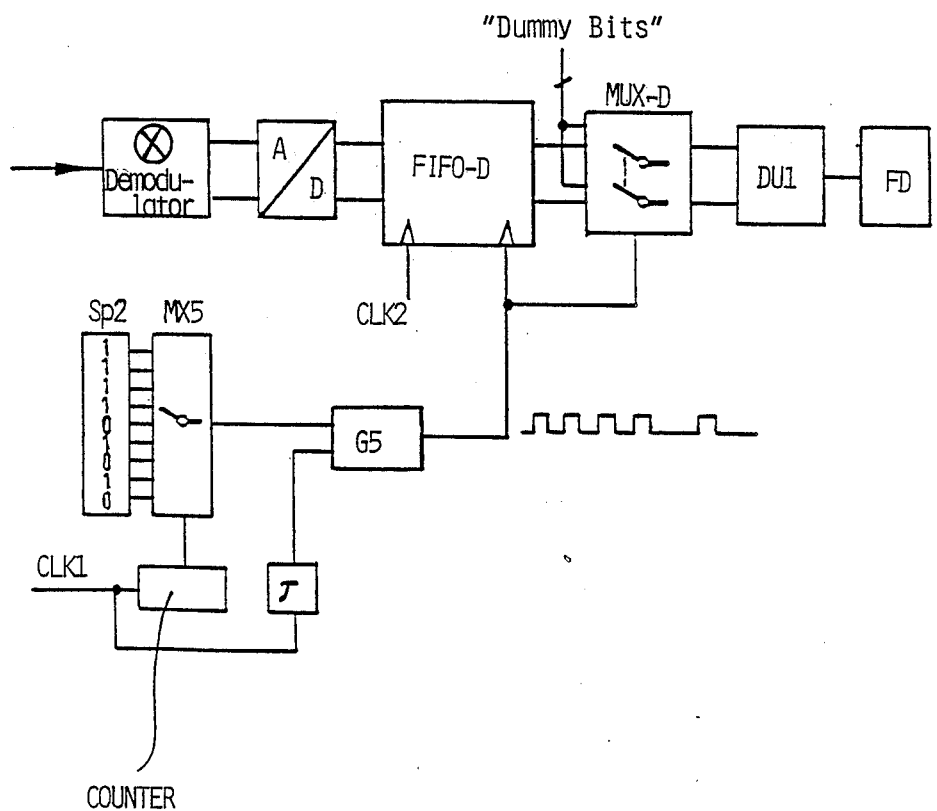
FIG. 6 is a block circuit diagram for depuncturing.

The de-puncturer at the receiver FIFO-D is shown in FIG. 6.

The data received and modulated by means of a demodulator are A/D converted and supplied to the input of the elastic memory FIFO-D. The de-puncturer at the receiver is constructed analogously to the puncturer at the transmitter, i.e. also processing in parallel. However, in the puncturer the FIFO write clock rate is interrupted while the read clock rate is continuous, while in the de-puncturer the FIFO write clock rate CLK2 is continuously supplied and the read clock rate CLK1 is interrupted. Interruption of the read clock rate is realized in the same manner as the interruption of the write clock rate at the transmitter, i.e. by means of an AND gate G5, which is supplied with the continuous clock rate CLK1 as well as the output signal of a multiplexer MX51. This multiplexer MX51 switches the de-puncturing pattern stored in a memory Sp2 to the gate G5. A multiplexer MUX-D is disposed downstream of the de-puncturer FIFO-D which inserts metric-neutral filler data, or "dummy bits", e.g. data from the center of a value range of a soft decision decoding, into the read-in breaks of the FIFO-D. A data rearranger DU1 at the receiver and a convolutional decoder FD follow the multiplexer MUX-D. Different embodiments for such a data rearranger at the receiver are described below. Data rearrangers are also provided at the receiver in the same way as the data rearrangers at the transmitter. They correspond in their construction to the rearrangers at the transmitter. So two elastic memories for each of the 6 channels are provided. As they are embodied as serial-parallel converters their outputs are switched in parallel. Inverse to the elastic memories at the transmitter, these FIFO memories perform continous read-in and alternate read-out.

For serial code puncturing as shown in FIG. 5, each convolutional coder is connected to a parallel/series converter PS1, . . . , PS6 which converts the two output bit streams of each convolutional coder operating at a bit rate of 25 Mbd into a serial data stream at a bit rate of 50 Mbd. FIFO memory FIFO2 here has a 6×8 format. Write clock processing for this FIFO memory FIFO2 is similar to that of the embodiment of FIG. 4 and so is depuncturing. Multiplexers and demultiplexers MX1, MX21, MX22, MX31, MX32 and MX4 shown in FIG. 1 are composed, in the simplest case, of shift registers which, in the case of data subdivision, have one data input at the first memory cell and parallel outputs for each memory cell and, in the case of data combination, have parallel inputs for each memory cell and one data output at the last memory cell. Care need only be taken that the direction and speed of shifting of the shift registers at the transmitting end coincide with the direction and speed of shifting at the receiving end.

All coding stages, such as difference coders, convolutional coders and code puncturers, can be realized in an integrated circuit, for example in CMOS technology.

To forward the information by way of the correctly detected phase position of a convolutional decoder as quickly as possible to the other convolutional decoders, a data exchange BUS is provided between convolutional decoders FD1, . . . , FD6 (FIG. 1).

The convolutional decoder detects a false phase state by its metric calculation stages. Then an arbitrary switch is made in a phase ambiguity correction stage. With a certain time constant it is then observed whether the metric values converge. If this is not the case a further switch is made until a convergency of the metric can be observed. Then the decoder outputs the phase ambiguity correction state correlated with this last metric event. Phase ambiguity correction can be performed according to state of art, e.g. U.S. Pat. No. 4,660,274 or according to the references mentioned there.

The present disclosure relates to the subject matter disclosed in Federal Republic of Germany Patent Application No. P 37 30 547.6, filed Sept. 11th, 1987, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A method of processing an input data stream, comprising the steps of:
   subdividing the input data stream into a plurality of data substreams of a slower processing speed than that of the input stream;
   separately difference coding the data substreams;
   after said step of difference coding, separately convolutionally coding each of the difference coded substreams in the form of a corresponding set of at least two convolutionally coded output streams, each output stream of the set having a different corresponding phase type, the different phase types associated with each of the respective sets of output streams being the same for all of the sets;
   after said step of convolutionally coding, for each of the different phases types, combining into a separate corresponding phase component for transmission, the output streams that correspond to the phase type, from all of the sets, there being a separate phase component for each phase type;
   after said step of combining, transmitting the phase components to a channel; and
   receiving the transmitted phase components from the channel and convolutionally decoding all of the data substreams utilizing all of the data of each of the received phase components.

2. A method as in claim 1, further comprising the steps of puncturing the substreams of difference and convolutionally coded data before said step of transmitting and correspondingly depuncturing the data substreams after said step of receiving.

3. A method as in claim 2, wherein the steps of puncturing and depuncturing are performed by parallel processing.

4. A method as in claim 3, further comprising the steps of:
   after said step of receiving, separating each of the received phase components into respective data substreams; and
   difference decoding the separated data substreams, said step of convolutionally decoding including the step of jointly convolutionally decoding a data substream from each phase component such that each of the convolutionally decoded data substreams is a respective combination of data from all of the phase components.

5. A method as in claim 1, further comprising the steps of:

after said step of receiving, separating each of the received phase components into respective data substreams; and difference decoding the separated data substreams, said step of convolutionally decoding including the step of jointly convolutionally decoding a data substream from each phase component such that each of the convolutionally decoded data substreams is a respective combination of data from all of the phase components.

6. A data processing system, comprising:

demultiplexer means for forming data substreams from an input data stream, a plurality of difference coders, one for each data stream, coupled to said demultiplexer means for difference coding the respective data substreams;

a plurality of convolutional coders, one for each data substream, coupled to said difference coders for convolutionally coding the difference coded data of each data substream; and at least two first multiplexer means coupled to said plurality of convolutional coders, for forming phase components from the convolutionally coded data substreams such that each of the phase components is a combination of all the convolutionally coded data substreams.

7. A system as in claim 6, further comprising:

means for transmitting the phase components formed by said at least two first multiplexer means;

means for receiving the phase components formed by said transmitting means;

at least two second multiplexer means for dividing the respective received phase components into data substreams;

a plurality of convolutional decoder means, each convolutional decoder means being coupled to each of said second multiplexer means so as to receive from each of said second multiplexer means a corresponding one of the data substreams for convolutionally decoding the corresponding data substreams for all of the phase components;

a plurality of difference decoder means coupled to the plurality of convolutional decoder means for difference decoding the convolutionally decoded data substreams; and a third multiplexer means for combining the convolutionally decoded and difference decoded data substreams.

8. A system as in claim 7, further comprising a plurality of parallel puncturers, each coupled to a respective one of said convolutional coders.

9. A system as in claim 8, further comprising a plurality of parallel depuncturers, each coupled to the input of a respective one of said convolutional decoders.

10. A system as in claim 9, further comprising a data bus means, coupled between said convolutional coders, for forwarding a correctly detected phase position from one of said convolutional decoders to all of the others of said convolutional decoders.

11. A system as in claim 7, further comprising a data bus means, coupled between said convolutional coders, for forwarding a correctly detected phase position from one of said convolutional decoders to all of the others of said convolutional decoders.

12. A system as in claim 7, further comprising a plurality of parallel depuncturers, each coupled to the input of a respective one of said convolutional decoders.

13. A system as in claim 6, further comprising a plurality of parallel puncturers, each coupled to a respective one of said convolutional coders.

14. A method of processing an input data stream, comprising the steps of:

subdividing the input data stream into a plurality of data substreams of a slower processing speed than that of the input stream;

separately difference coding the data substreams;

after said step of difference coding, separately convolutionally coding the difference coded substreams;

after said step of convolutionally coding, combining all of the data of the separate difference and convolutionally coded substreams obtained in said step of convolutionally coding into each of at least two phase components for transmission;

after said step of combining, transmitting the at least two phase components of the combined data substreams to a channel;

receiving the transmitted phase components from the channel;

separating each of the received phase components into respective data substreams;

convolutionally decoding all of the data substreams utilizing all of the data of each of the received phase components, said step of convolutionally decoding including the step of jointly convolutionally decoding a data substream from each phase component such that each of the convolutionally decoded data substreams is a respective combination of data from all of the phase components; and difference decoding the separated data substreams.

15. A method as in claim 14, further comprising the steps of puncturing the substreams of difference and convolutionally coded data before said step of transmitting and correspondingly depuncturing the data substreams after said step of receiving.

16. A method as in claim 15, wherein the steps of puncturing and depuncturing are performed by parallel processing.

* * * * *